(12) United States Patent
Masselink et al.

(10) Patent No.: US 8,971,369 B2
(45) Date of Patent: Mar. 3, 2015

(54) QUANTUM CASCADE LASER STRUCTURE

(75) Inventors: William Ted Masselink, Berlin (DE); Mykhaylo Petrovych Semtsiv, Berlin (DE)

(73) Assignee: Quantiox GmbH, Berlin-Adlershof (DE)

( * ) Notice: Subject to any disclaimer, the term of this patent is extended or adjusted under 35 U.S.C. 154(b) by 121 days.

(21) Appl. No.: 13/443,244

(22) Filed: Apr. 10, 2012

(65) Prior Publication Data

US 2013/0266036 A1   Oct. 10, 2013

(51) Int. Cl.
*H01S 5/00* (2006.01)

(52) U.S. Cl.
USPC .................. 372/45.01; 372/43.01; 372/68

(58) Field of Classification Search
CPC .... H01S 5/3402; H01S 5/3415; H01S 5/3406
USPC ...................... 372/43.01, 45.01, 68
See application file for complete search history.

(56) References Cited

U.S. PATENT DOCUMENTS

| | | | |
|---|---|---|---|
| 7,848,376 B2 | 12/2010 | Masselink et al. | |
| 7,893,425 B2 | 2/2011 | Masselink et al. | |
| 2009/0034570 A1* | 2/2009 | Masselink et al. | 372/45.012 |
| 2010/0002739 A1* | 1/2010 | Hu et al. | 372/45.01 |
| 2011/0080930 A1* | 4/2011 | Liu et al. | 372/45.012 |

OTHER PUBLICATIONS

Y. Bai et al., "Highly Temperature Insensitive Quantum Cascade Lasers," Applied Physics Letters 97, 251104 (2010), 3 pages.
M. P. Semtsiv et al., "Above Room Temperature Operation of Short Wavelength ($\lambda$=3.8 µm) Strain-Compensated . . . " Applied Physics Letters, vol. 85, No. 9, Aug. 30, 2004, pp. 1478-1480.

* cited by examiner

*Primary Examiner* — Yuanda Zhang
(74) *Attorney, Agent, or Firm* — Rothwell, Figg, Ernst & Manbeck, P.C.

(57) ABSTRACT

A quantum cascade laser structure having a plurality of cascades each of which comprises a number of alternately arranged quantum wells and barriers of different thicknesses and heights, wherein at least one of the quantum wells and at least one of the barriers is under mechanical strain and the quantum wells and the barriers are coordinated such that the existing mechanical strains are largely compensated within one cascade, wherein each of the barriers comprise one or more barrier layers, wherein each cascade comprises a thinnest quantum well, a lowest barrier, a thickest quantum well, a highest barrier, and the highest barrier is followed by alternately arranged quantum wells and barriers.

21 Claims, 5 Drawing Sheets

QUANTUM CASCADE LASER STRUCTURE

BACKGROUND OF THE INVENTION

Field of the Invention

The present invention relates to a quantum cascade laser structure having engineered interface-roughness scattering in the active region to achieve simultaneous increase of the lifetime of the upper laser state and decrease of the lifetime of the lower laser state to significantly reduce laser threshold. The invention furthermore relates to a quantum cascade laser (QCL) having significantly reduced laser threshold based on engineered interface-roughness scattering in the active region.

The quantum cascade laser (QCL) was first demonstrated in 1994 and described as a stack of active regions and digitally graded alloys (injector regions) made out of InGaAs quantum wells and InAlAs barriers lattice matched to InP (Faist et al., Science 264, 553, 1994). Population inversion was achieved by reducing the spatial overlap of the upper and lower laser states and the resonant longitudinal-optical (LO)-phonon depopulation of the lower laser state into the underlying confined states (Faist et al., Science 264, 553, 1994). Since the invention of the QCL, a number of design variations have been proposed, each improving the QCL performance in different respects. Some of the designs, like superlattice active-region, bound-to-continuum, and injectorless designs, differ significantly from the original QCL description (Faist et al., Science 264, 553, 1994), both in the layer structure, and in the way the population inversion is achieved. Nevertheless, all the above approaches are referred to as QCLs, as the name expresses the essential quantum nature of the exploited transitions and the unique possibility to stack (cascade) several emitting periods together.

The initial understanding of the scattering processes in QCL was focused on inelastic LO-phonon scattering, believed to be dominant. Indeed, the LO-phonon scattering usually dominates in quantum wells at room temperature and above, but elastic scattering generally dominates at cryogenic temperatures. The impact of the interface scattering rate depends both on the barrier height and on the interface roughness. Thus, for systems with smooth interfaces and low barrier height, such as AlGaAs/GaAs, LO-phonon scattering is expected to dominate and has been demonstrated to do so through magnetic field measurements. The same experiment, however, carried out on strain-compensated high-barrier InP-based QCL shows elastic scattering (Semtsiv et al., Appl. Phys. Lett. 93, 2008).

Altogether, the impact of elastic scattering is high, even at room temperature, particularly for materials with high-barriers and rough interfaces. At the same time, high-barriers based on strained heterostructures are advantageous for short wavelength QCLs because they provide the necessary confinement of the upper laser state. The high internal strain precludes the possibility to smooth the interfaces by growth interruptions.

BRIEF SUMMARY OF THE INVENTION

The invention includes a method to increase the population inversion in high-barrier strain-compensated QCLs by grading the average barrier height in such a way so that the lowest barrier(s) is (are) used where the upper laser state has its maximum probability and the highest barriers are used where the lower laser state and the few subsequent states have their highest probabilities. By combining differing barrier heights in this way, the lifetime of the upper laser state is increased, while simultaneously the lifetime of the lower laser state is decreased; thus, the population inversion is significantly enhanced.

The invention is also drawn to a quantum cascade laser structure having a plurality of cascades each of which comprises a number of alternately arranged quantum wells and barriers of different thicknesses and heights, wherein at least one of said quantum wells and at least one of said barriers is under mechanical strain and the quantum wells and the barriers are coordinated such that the existing mechanical strains are largely compensated within one cascade, wherein each of said barriers comprise one or more barrier layers, wherein each cascade comprises sequentially: a thinnest quantum well, followed by a lowest barrier, followed by a thickest quantum well, which is then followed by a highest barrier, and the highest barrier is followed by alternately arranged quantum wells and barriers.

The invention is also drawn to a quantum cascade laser structure where the quantum wells each have thickness between the thinnest quantum well and the thickest quantum well, with the quantum wells having decreasing thicknesses compared to the thickest quantum well in sequential order, and the barriers each have average barrier layer height that is no higher than an immediately preceding barrier.

Further, the invention is drawn to a quantum cascade laser having one or more cascades arranged as described herein.

DETAILED DESCRIPTION OF THE INVENTION

Figure 1:
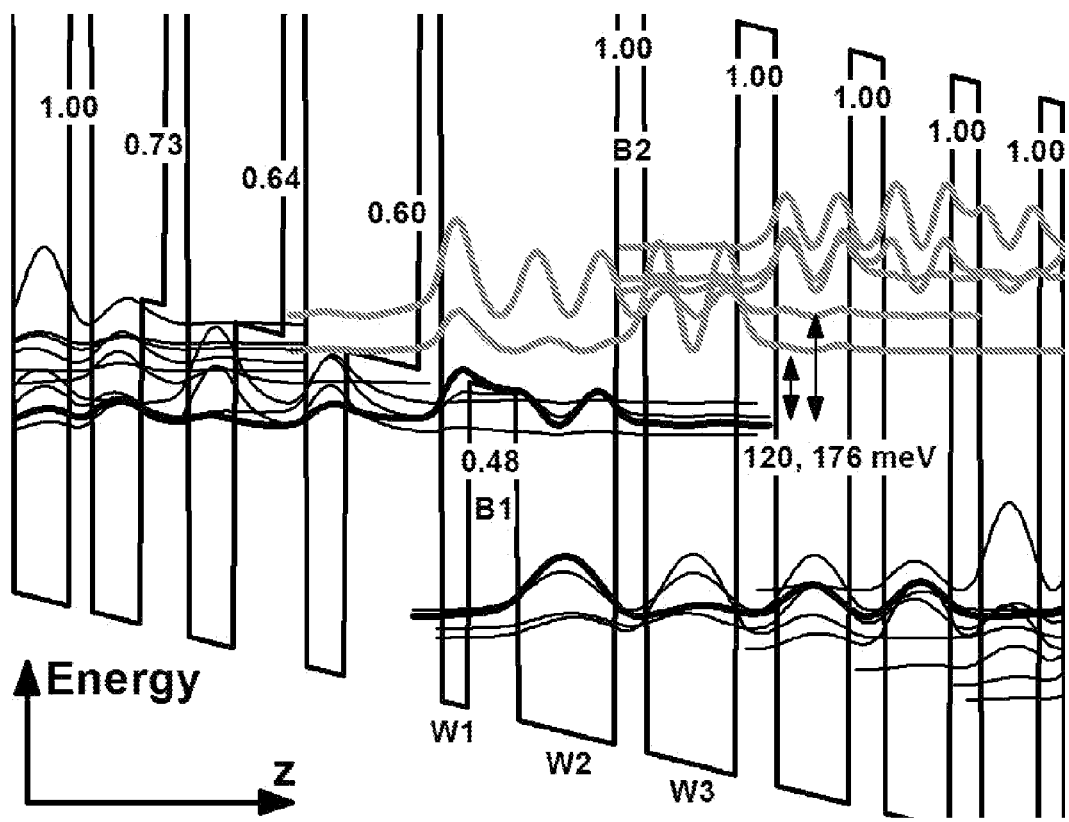
FIG. 1 depicts the $\Gamma$-valley conduction band edge profile for the design used within a single period (cascade) under an electric field of 100 kV/cm along with the calculated probability functions for the confined electronic states.

The quantum cascade laser structure in accordance with the invention comprises a number of cascades, i.e., at least two cascades and preferably 10 to 200 cascades, more preferably 25 to 100, each of which comprise a number of alternately arranged quantum wells and barriers. A well or a barrier is composed of one or more layers. For example, the barriers can be composite, utilizing more than one barrier material as described in U.S. Pat. No. 7,848,376, which is incorporated herein by reference in its entirety. In some embodiments, one or more barrier and one or more well, are independently composite, i.e., contain two or more layers. In one embodiment, a barrier may contain AlAs and InAlAs layers. In one embodiment, a well may contain InGaAs, InAs, and/or InGaAs layers. In certain embodiments, the conduction band offset between the wells and the barriers (barrier height) can be from between about 0.1 eV and about 5 eV. Well and barrier thicknesses can be between about 0.2 nm and about 20 nm.

In certain embodiments, at least one well layer and at least one barrier layer are strained, with the respective strains in particular may being tensile strains or compression strains. In the case of a composite barrier, i.e., a barrier having more than one constituent layer, the height mentioned herein is the average height of the barrier layer constituents that make up the composite barrier. The quantum wells and barriers are coordinated in the quantum cascade laser structure in accordance with the invention in a way such that any strain is largely compensated within one cascade. Largely compensated should be understood to mean that the compensation does not necessarily need to be complete, but only to such an extent that there is small enough strain, or no strain that would make pseudo-morphological growth impossible. One skilled in the art understands pseudo-morphological growth to be a growth where an adsorbed crystalline layer having a different crystalline structure and/or a different lattice constant than the substrate accepts the crystalline structure and the lattice constant of the substrate.

In one embodiment, the material of the quantum wells has only one respective constituent material and the material of at least one of the barrier layers has at least two constituents materials, wherein the two constituent materials may have different constituents or the same constituents in various quantity ratios. The constituent materials of a layer may comprise, for example, the elements Al (aluminum), Ga (gallium), As (Arsenic) or In (Indium) as constituents.

In one embodiment, one or more cascades each have InGaAs wells and InAlAs barriers. In certain embodiments, the wells are strained $In_{0.73}Ga_{0.27}As$ wells and the barriers are strained $In_{1-x}Al_xAs$ barriers. In some embodiments, the average Al-content is between x=0.3 for the lowest barrier and x=1.0 for the highest barrier. In one embodiment, x=0.48 for the lowest barrier layer and x=1.0 for the highest barrier. In certain embodiments, x≤1.0 for successive barrier layers after the highest barrier layer in the z direction.

In one embodiment, the quantum well width becomes progressively narrower, beginning at the thickest well up to the thinnest well. The barrier height—in composite barriers, the average barrier height—is made progressively smaller from the largest barriers in the extraction region to the smallest composite barrier. The barrier thicknesses are designed to provide the proper ground state miniband at the operation bias while satisfying strain compensation within each cascade period.

In certain embodiments, rather than using composite barriers, the Al-content of the $In_{1-x}Al_xAs$ barriers could also simply be continuously varied. In one embodiment, metal-organic vapor-phase epitaxy can be used. Using molecular-beam epitaxy or gas-source molecular-beam, it is possible to grade the average barrier height by growing composite multilayer barriers.

According to the present invention, it is possible to further increase the lifetime of the upper laser state by using a low potential barrier between the thinnest and thickest wells, where the overlap with the upper laser level is greatest and the overlap with the lower laser level is very modest. The impact of the barrier height on the lifetime of the relevant states is due to intersubband scattering due to interface-roughness as described in Prange and Nee, Phys. Rev. 168, 779 (1968), which depends on the average rms height of the roughness Δh, its characteristic lateral size ˆ, and the amplitude of the conduction band offset $\delta U(z_i)$ at the individual interface i. The intersubband scattering rate, $1/\tau_{m,n}$, is then written as $$\frac{1}{\tau_{m,n}} = \frac{\pi m_c}{\hbar^3}\Delta^2\Lambda^2\sum \delta U^2(z_i)[\varphi_n^2(z_i) - \varphi_m^2(z_i)]^2, \quad \text{(Equation 1)}$$

where the sum is calculated across all the interfaces, i.

Compared to the quantum cascade laser structures with strain compensation, as described in the state of the art, the quantum cascade laser structure in accordance with the invention has significantly narrower electroluminescence spectrum and significantly reduced room-temperature threshold current density. Compared to the reference laser, electroluminescence half-width at cryogenic temperature went down from ~42 meV to 20 meV, the room temperature threshold current density went down from ~4.8 kA/cm² to ~1.76 kA/cm².

In the quantum cascade laser structure in accordance with the invention, the cascade may comprise an injection zone, an extraction zone, and an active zone arranged in-between the injection and extraction zones, where the actual emission of the laser radiation occurs, with each zone comprising at least one barrier layer. In one embodiment, at least one of the barrier layers in the active zone and/or the injection zone comprises at least two constituent materials.

In one embodiment, the present invention includes a quantum cascade laser structure having a plurality of cascades each of which comprises a number of alternately arranged quantum wells and barriers of different thicknesses and heights. In certain embodiments, at least one of the quantum wells and at least one of the barriers is under mechanical strain. In some embodiments, the quantum wells and the barriers are coordinated such that the existing mechanical strains are largely compensated within one cascade. Each of the barriers can be composed of one or more barrier layers referred to as constituent barrier layers or constituent layers.

In one embodiment, each cascade of the inventive quantum cascade laser structure comprises, sequentially, a thinnest quantum well, followed by a lowest barrier, followed by a thickest quantum well, which is then followed by a highest barrier. The "thinnest" quantum well is the quantum well having the smallest thickness compared to any other quantum well within the same cascade. The "thickest" quantum well is the quantum well having the largest thickness compared to any other quantum well within the same cascade. The "lowest" barrier is the barrier having the smallest height, or average height if it is a composite barrier, compared to any other barrier within the same cascade. The "highest" barrier is the barrier having the largest height, or average height if it is a composite barrier, compared to any other barrier within the same cascade.

As used herein, the phrase "followed by" refers to a subsequent, adjacent barrier or well in the z-direction of a cascade.

As is well understood by those of ordinary skill in the art, the "z-direction" is along the direction of epitaxial growth.

In certain embodiments, the highest barrier is followed by alternately arranged quantum wells and barriers. In some embodiments, the quantum wells of the alternately arranged quantum wells and barriers following the highest barrier each have a thickness between that of the thinnest quantum well and that of the thickest quantum well. In certain embodiments, the quantum wells of the alternately arranged quantum wells and barriers following the highest barrier have decreasing thicknesses compared to the thickest quantum well in sequential order. In certain embodiments, the barriers of the alternately arranged quantum wells and barriers each have average barrier layer height that is no higher than an immediately preceding barrier.

In preferred embodiments, the barriers of the alternately arranged quantum wells and barriers each have average barrier layer height that is between that of the lowest barrier and that of the highest barrier. In certain embodiments, the barriers of the alternately arranged quantum wells and barriers each have decreasing average barrier layer heights compared to the highest barrier in sequential order.

In another embodiment, the quantum cascade laser structure has a plurality of cascades, each of which extends in a z-direction, and comprises a number of alternately arranged quantum wells and barriers of different thicknesses and heights. At least one of the quantum wells and at least one of the barriers is under mechanical strain and the quantum wells and the barriers are coordinated such that the existing mechanical strains are largely compensated within one cascade. The barriers can comprise, i.e., be constituted by, one or more barrier layers. The barrier layers can be of different heights and made from the same or different materials.

In one embodiment, each cascade sequentially has a thinnest quantum well followed by a lowest barrier, where the lowest barrier has two or more barrier layers having a quantum well inserted between each of said barrier layers, followed by a quantum well having thickness that is between that of said thinnest quantum well and that of said thickest quantum well, followed by a highest barrier followed by a thickest quantum well, followed by alternately arranged barriers and quantum wells.

Preferably, the quantum wells of the alternately arranged barriers and quantum wells following the thickest quantum well each have thickness between that of the thinnest quantum well and that of the thickest quantum well. In a preferred embodiment, the quantum wells have decreasing thicknesses compared to the thickest quantum well in sequential order, and the barriers each have average barrier layer height that is no higher than an immediately preceding barrier.

In one embodiment, the barriers of the alternately arranged barriers and quantum wells following the thickest quantum well each have average barrier layer height that is between said lowest barrier and said highest barrier, with the barriers having decreasing average barrier layer heights compared to the highest barrier in sequential order.

In one embodiment, the quantum well layer(s) inserted between each of the barrier layers is/are made of the same material as the thinnest and thickest quantum wells. In another embodiment, the quantum well layer(s) inserted between each of the barrier layers is/are made of different materials.

In one embodiment, the quantum well layer(s) inserted between each of the barrier layers has/have thickness that is between that of the thinnest quantum well and that of the thickest quantum well.

According to the embodiment where the cascade comprises a thinnest quantum well followed by a lowest barrier, where the lowest barrier has two or more barrier layers having a quantum well inserted between each of said barrier layers, followed by a quantum well having thickness that is between that of said thinnest quantum well and that of said thickest quantum well, followed by a highest barrier followed by a thickest quantum well, followed by alternately arranged barriers and quantum wells, the thicknesses of the quantum wells and the heights of the barriers are optimally arranged so that a wave length spectrum of an emitted laser radiation is between about 5 to 10 µm, preferably between about 6-8 µm.

In an alternative embodiment, each cascade comprises sequentially a thinnest quantum well, wherein the thinnest quantum well comprises two or more quantum well layers having a barrier inserted between each of said quantum well layers, followed by a lowest barrier, followed by a quantum well having thickness that is between that of the thinnest quantum well and that of the thickest quantum well, followed by a highest barrier, followed by a thickest quantum well, followed by alternately arranged barriers and quantum wells.

In one embodiment, at least one cascade or each cascade of the inventive quantum cascade laser structure has InGaAs quantum wells.

In one embodiment, at least one cascade or each cascade of the inventive quantum cascade laser structure has InAlAs barriers. In certain embodiments, at least one cascade or each cascade of the inventive quantum cascade laser structure has AlAsSb barriers.

In one embodiment, at least one cascade or each cascade of the inventive quantum cascade laser structure has InGaAs quantum wells and InAlAs or AlAsSb barriers.

In one embodiment, at least one cascade or each cascade of the inventive quantum cascade laser structure has InGaAs quantum wells that independently have the formula $In_zGa_{1-z}As$, wherein $z=0.5$ to $1.0$. Preferably, z is $0.6$ to $0.9$.

In one embodiment, at least one cascade or each cascade of the inventive quantum cascade laser structure has InAlAs barriers that independently have the formula $In_{1-x}Al_xAs$, wherein $x=0.3$ to $1.0$. Preferably, z is $0.4$ to $0.9$.

In one embodiment, at least one cascade or each cascade of the inventive quantum cascade laser structure has one or more $In_xGa_{1-x}As$ layers, where $0.5 \leq x \leq 1$, preferably $0.6 \leq x \leq 0.9$, as a constituent material of the quantum wells and one or more $In_yAl_{1-y}As$ layers, where $0.3 \leq y \leq 1$, preferably $0.4 \leq y \leq 0.6$ and one or more AlAs layers, as constituent materials of at least one barrier. In certain embodiments, the constituent material of the quantum wells is $In_{0.73}Ga_{0.27}As$. In certain embodiments, the constituent material or materials of the barriers is $In_{0.52}Al_{0.48}As$ and/or AlAs. In certain embodiments, the cascade includes $In_{0.52}Al_{0.48}As$ and AlAs barrier layers as constituent materials of at least one barrier with at least two layer constituents, and a AlAs barrier layer as the constituent material of barriers having only one layer constituent.

In certain embodiments, the cascade comprises an injection zone, an extraction zone and an active zone arranged between the injection zone and the extraction zone, with each zone comprising at least one barrier layer. In some embodiments, at least one of the barriers in the active zone and/or in the injection zone has at least two layer constituent materials.

In some embodiments, the thicknesses of the quantum wells and the heights of the barriers are arranged so that a wave length spectrum of an emitted laser radiation is about 2.9 to about 20 µm. Preferably, the wave length spectrum of an emitted laser radiation is about 2.9 to about 14 µm. More preferably, the wave length spectrum of an emitted laser radiation is about 2.9 to about 5.3 µm.

In some embodiments, the thicknesses of the quantum wells and the heights of the barriers are selected and arranged so as to achieve simultaneous increased upper laser state lifetime and reduced lower laser state lifetime.

In one embodiment, the invention is a quantum cascade laser structure having a number of cascades, each of which comprises a number of alternately arranged quantum wells and barriers, where the material of at least one quantum well is under mechanical strain, the material of at least one barrier layer is under mechanical strain:

the quantum wells and the barriers are coordinated such that the existing mechanical strains are largely compensated within one cascade, wherein a cascade comprises the following layers with the stated constituent materials and layer thicknesses in the stated order:

an $In_xGa_{1-x}As$-layer with $0.6 \leq x \leq 1$, with a thickness of 0.9 to 1.3 nm;
an $In_zAl_{1-z}As$ layer with $0.45 \leq z \leq 0.65$, with a thickness of 1.0 to 3.0 nm;
an $In_xGa_{1-x}As$-layer with $0.6 \leq x \leq 1$, with a thickness of 3.5 to 4.5 nm;
an $In_zAl_{1-z}As$-layer with $0 \leq z \leq 0.4$, with a thickness of 1.0 to 1.4 nm;
an $In_xGa_{1-x}As$-layer with $0.6 \leq x \leq 1$, with a thickness of 3.4 to 4.0 nm;
an $In_zAl_{1-z}As$-layer with $0 \leq z \leq 0.4$, with a thickness of 1.4 to 1.8 nm;
an $In_xGa_{1-x}As$-layer with $0.6 \leq x \leq 1$, with a thickness of 2.8 to 3.2 nm;
an $In_zAl_{1-z}As$-layer with $0 \leq z \leq 0.4$, with a thickness of 1.2 to 1.6 nm;
an $In_xGa_{1-x}As$-layer with $0.6 \leq x \leq 1$, with a thickness of 2.5 to 2.9 nm;
an $In_zAl_{1-z}As$-layer with $0 \leq z \leq 0.4$, with a thickness of 1.0 to 1.4 nm;
an $In_xGa_{1-x}As$-layer with $0.6 \leq x \leq 1$, with a thickness of 2.2 to 2.6 nm;
an $In_zAl_{1-z}As$-layer with $0 \leq z \leq 0.4$, with a thickness of 0.8 to 1.2 nm;
an $In_xGa_{1-x}As$-layer with $0.6 \leq x \leq 1$, with a thickness of 2.1 to 2.5 nm;
an $In_zAl_{1-z}As$-layer with $0 \leq z \leq 0.4$, with a thickness of 0.7 to 1.1 nm;
an $In_xGa_{1-x}As$-layer with $0.6 \leq x \leq 1$, with a thickness of 1.8 to 2.1 nm;
an $In_zAl_{1-z}As$-layer with $0 \leq z \leq 0.55$, with a thickness of 1.7 to 2.1 nm;
an $In_xGa_{1-x}As$-layer with $0.6 \leq x \leq 1$, with a thickness of 1.7 to 2.1 nm;
an $In_zAl_{1-z}As$-layer with $0 \leq z \leq 0.55$, with a thickness of 2.6 to 3.2 nm;
an $In_xGa_{1-x}As$-layer with $0.6 \leq x \leq 1$, with a thickness of 1.4 to 1.8 nm;
an $In_zAl_{1-z}As$-layer with $0 \leq z \leq 0.55$, with a thickness of 3.5 to 4.3 nm.

In another embodiment, the invention is a quantum cascade laser structure having the following layers with the stated constituent materials and layer thicknesses in the stated order:

an $In_{0.73}Ga_{0.27}As$ layer with a thickness of about 1.1 nm;
an InAlAs layer with a thickness of about 2.0 nm;
an $In_{0.73}Ga_{0.27}As$ layer with a thickness of about 4.0 nm;
an InAlAs layer with a thickness of about 1.2 nm;
an $In_{0.73}Ga_{0.27}As$ layer with a thickness of about 3.7 nm;
an InAlAs layer with a thickness of about 1.6 nm;
an $In_{0.73}Ga_{0.27}As$ layer with a thickness of about 3.0 nm;
an InAlAs layer with a thickness of about 1.4 nm;
an $In_{0.73}Ga_{0.27}As$ layer with a thickness of about 2.7 nm;
an InAlAs layer with a thickness of about 1.2 nm;
an $In_{0.73}Ga_{0.27}As$ layer with a thickness of about 2.4 nm;
an InAlAs layer with a thickness of about 1.0 nm;
an $In_{0.73}Ga_{0.27}As$ layer with a thickness of about 2.3 nm;
an InAlAs layer with a thickness of about 0.9 nm;
an $In_{0.73}Ga_{0.27}As$ layer with a thickness of about 2.0 nm;
an InAlAs layer with a thickness of about 1.9 nm;
an $In_{0.73}Ga_{0.27}As$ layer with a thickness of about 1.9 nm;
an InAlAs layer with a thickness of about 2.9 nm;
an $In_{0.73}Ga_{0.27}As$ layer with a thickness of about 1.6 nm;
an InAlAs layer with a thickness of about 3.9 nm.

In another embodiment, the invention is drawn to a quantum cascade laser having the quantum cascade laser structure as described above and means for selecting a wavelength of emitted laser light.

In certain embodiments, quantum cascade laser is connected to a heat sink to dissipate heat generated in the operation of the laser.

In certain embodiments, the quantum cascade laser structure contains nanostructures as described in U.S. Pat. No. 7,893,425, which is incorporated herein by reference in its entirety.

In another embodiment, the invention includes a method of increasing population inversion in a high barrier strain-compensated quantum cascade laser by grading average barrier height so that a barrier having lowest height is used when an upper laser state has its maximum probability and a barrier having highest height is used where a lower laser state has maximum probability.

In certain embodiments, the invention is directed to a method for enhancing population inversion in a high barrier strain-compensated quantum cascade laser structure having a plurality of cascades each having alternately arranged quantum wells and barriers of different heights and thicknesses. The method involves selecting thicknesses of quantum wells and heights of barriers and arranging said quantum wells and barriers such that the thinnest quantum well in the cascade is followed by a barrier of lowest height in the cascade, followed by a quantum well that is the thickest quantum well in the cascade, followed by a barrier of highest height in the cascade, and wherein said highest barrier is followed by alternately arranged quantum wells and barriers.

In one embodiment, the method involves providing a quantum cascade laser structure to have quantum wells following the highest barrier each having thickness between the thinnest quantum well and the thickest quantum well and being of decreasing thicknesses in sequential order following the thickest quantum well. In certain embodiments, the barriers following the highest barrier each have average barrier layer height that is no higher than an immediately preceding barrier.

In certain embodiments, the method involves arranging the quantum cascade laser structure to have alternately arranged quantum wells and barriers have gradually decreasing thicknesses and heights compared to the thickest quantum well layer and said barrier layer of highest height, respectively.

In one embodiment, the method involves arranging the quantum cascade laser structure to have one or more InGaAs quantum wells.

In one embodiment, the method involves arranging the quantum cascade laser structure to have one or more InAlAs barrier layers.

In one embodiment, the method involves arranging the quantum cascade laser structure to have one or more InGaAs quantum wells and InAlAs barrier layers.

In one embodiment, the method involves arranging the quantum cascade laser structure to have at least one cascade or each cascade of the inventive quantum cascade laser structure with InGaAs quantum wells that independently have the formula $In_zGa_{1-z}As$, wherein $z=0.5$ to $1.0$. Preferably, $z$ is $0.6$ to $0.9$.

In one embodiment, the method involves arranging the quantum cascade laser structure to have at least one cascade or each cascade of the inventive quantum cascade laser structure with InAlAs barriers that independently have the formula $In_{1-x}Al_xAs$, wherein x=0.3 to 1.0. Preferably, z is 0.4 to 0.9.

In one embodiment, the method involves arranging the quantum cascade laser structure to have at least one cascade or each cascade of the inventive quantum cascade laser structure with one or more $In_xGa_{1-x}As$ layers, where $0.5 \leq x \leq 1$, preferably $0.6 \leq x \leq 0.9$, as a constituent material of the quantum wells and one or more $In_yAl_{1-y}As$ layers, where $0.3 \leq y \leq 1$, preferably $0.4 \leq y \leq 0.6$, and/or one or more $In_{1-y}Al_yAs$ layers, where $0.3 \leq y \leq 1$, preferably $0.4 \leq y \leq 0.6$, as constituent materials of at least one barrier. In certain embodiments, the constituent material of the quantum wells is $In_{0.73}Ga_{0.27}As$. In certain embodiments, the constituent material or materials of the barriers is $In_{0.52}Al_{0.48}As$ and/or AlAs. In certain embodiments, the cascade includes $In_{0.52}Al_{0.48}As$ and AlAs barrier layers as constituent materials of at least one barrier with at least two layer constituents, and a AlAs barrier layer as the constituent material of barriers having only one layer constituent.

In one embodiment, the method involves arranging the quantum cascade laser structure to have cascades that each have an injection zone, a extraction zone and an active zone arranged between the injection zone and the extraction zone, with each zone comprising at least one barrier layer and at least one of the barrier layers in the active zone and/or in the injection zone having at least two layer constituent materials.

In one embodiment, the method involves arranging the thicknesses of the quantum wells and the heights of the barriers within one or more cascades so that a wave length spectrum of an emitted laser radiation is 2.9 to 20 μm.

In one embodiment, the method includes selecting the thicknesses of the quantum wells and the heights of the barriers and arranging the quantum wells and barriers within one or more cascades so as to achieve simultaneous increased upper laser state lifetime and reduced lower laser state lifetime.

A quantum cascade laser in accordance with the invention comprises a lower waveguide layer, an upper waveguide layer and a quantum cascade laser structure in accordance with the invention arranged between said two waveguide layers. In particular, a quantum cascade laser in accordance with the invention may have a quantum cascade laser structure that can emit the laser radiation in several wave lengths and it may be equipped with means to select the wave length of the emitted laser light. A potential means for selecting the wave length, for example, may be a so-called external cavity or a grating. A combination of external cavity and grating is also possible.

To dissipate the heat created in the operation of the quantum cascade laser, a quantum cascade laser in accordance with the invention may be connected to a heat sink, which may be realized, for example, as a so-called buried hetero structure or as a so-called epilayer-down mounting. By dissipating excess heat into the heat sink, the performance of the quantum cascade laser can be improved in particular in operation at temperatures in the 300 K range.

Using gas-source molecular beam epitaxy and holding the Al-cell temperature constant, the average barrier height was graded by growing composite multi-layer barriers, similar as in the reference laser, described in Semtsiv et al., Appl. Phys. Lett. 85, 1478 (2004). The QCL wafer containing 40 active periods was grown by gas-source molecular-beam epitaxy as described in Semtsiv et al., Appl. Phys. Lett. 85, 1478 (2004). The laser ridges were fabricated using conventional optical lithography and wet chemical etching. Approximately 500 nm $SiO_2$ deposited by reactive magnetron sputtering was used for electrical insulation of the side-walls. Cr/Au layers were used for the top metallization. The cleaved laser chips were In-soldered directly on copper sub-mount for testing. Compared to the reference laser, the inventive laser resulted in the narrowing of the electroluminescence spectrum by 40% and in a 40% reduction of the room-temperature threshold current density.

FIG. 1 depicts the conduction band profile and modulisquare of the Wannier-Stark states of a single cascade under 100 kV/cm bias. The upper and lower laser states are highlighted with thick solid lines. The ground states are in black and the excited states are in gray. The average Al-content in the composite barriers is indicated for each barrier. The layer thickness in nm starting from the thinnest well, W, is: 1.1/2.0/4.0/1.2/3.7/1.6/3.0/1.4/2.7/1.2/<u>2.4</u>/1.0/<u>2.3</u>/0.9/2.0/1.9/1.9/2.9/1.6/3.9. The strained $In_{0.73}Ga_{0.27}As$ well layers are in roman and the strained digital-alloy InAlAs layers (composed of $In_{0.52}Al_{0.48}As$ and AlAs) layers are in bold. Underlined layers are doped to $1 \times 10^{18}$ cm$^{-3}$. In the design used for FIG. 1, a single cascade consists of strained $In_{0.73}Ga_{0.27}As$ wells and strained $In_{1-x}Al_xAs$ barriers of various average Al-content between x=0.48 (for B1) and x=1.00 (for B2 and the few following barriers). The well width becomes progressively narrower, beginning at the thickest well (W2) up to the thinnest well (W1). The barrier height—in composite barriers, the average barrier height—is made progressively smaller from the largest barriers (B2) in the extraction region to the smallest composite barrier (B1). FIG. 1 shows W1 followed by B1; B1 is followed by W2; and W2 is followed by B2. B2 is followed by alternately arranged quantum wells and barriers. The average Al-content for the corresponding composite barriers is indicated on FIG. 1. The probabilities of the upper and the lower laser states are intentionally shifted relative to each other in the z-direction in the conventional way to achieve a compromise between upper laser level lifetime and dipole matrix element for the laser transition.

Figure 2:
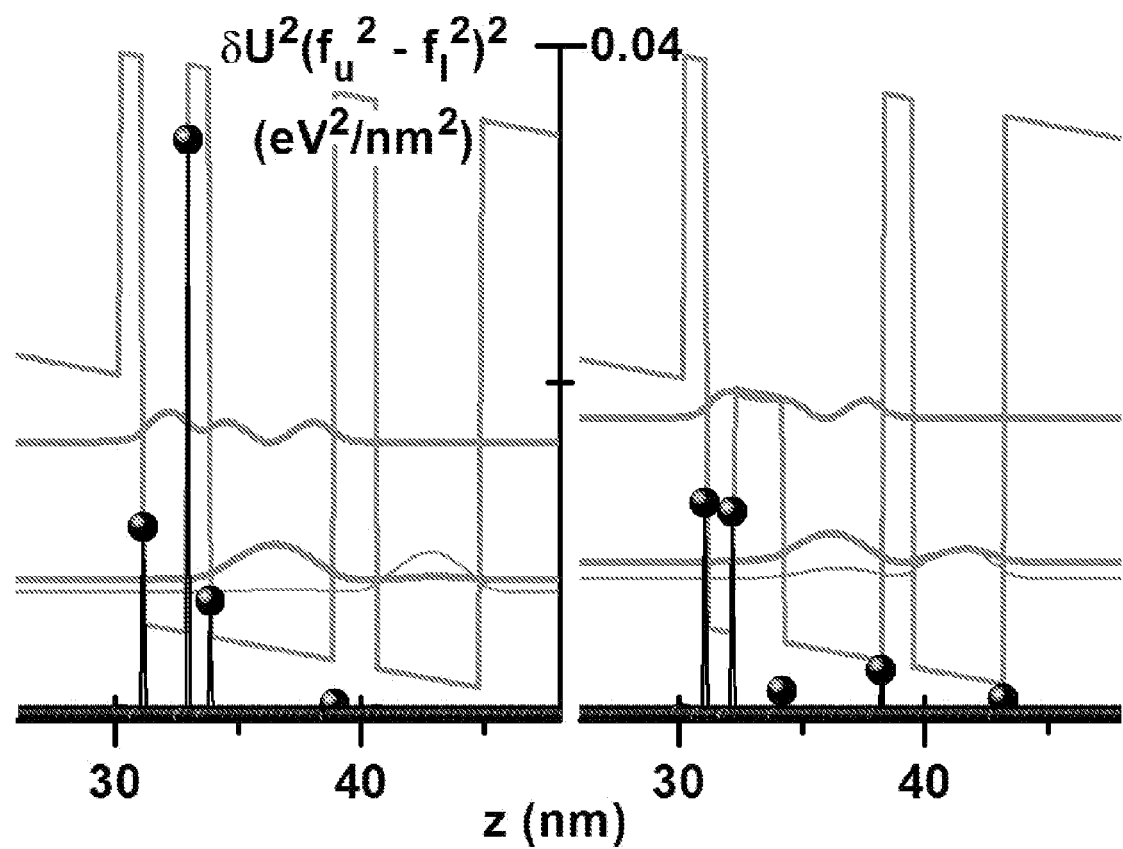
FIG. 2 illustrates the impact of individual interfaces on the intersubband scattering between the upper laser state and the lower laser state calculated for the three-well section of the transition region of the reference design (left) and the current design (right).

FIG. 2 plots the term $\delta U^2(z_i)[\phi_n^2(z_i)-\phi_m^2(z_i)]^2$ calculated for the scattering between the upper and the lower laser states, directly depicting the impact of the individual interfaces on the total scattering rate. The impact of B1 on the total scattering rate in current design (FIG. 2 right panel) is very modest, while the same calculation made for the reference design (FIG. 2 left panel) indicates that the largest contribution to the interface scattering comes from the scattering on the thin and high AlAs barrier between W1 and W2 that is in place of B1. The term $\Sigma \delta U^2(z_i)[\phi_n^2(z_i)-\phi_m^2(z_i)]^2$ of equation 1 is calculated to be 0.031 eV$^2$/nm$^2$ for the current structure and 0.054 eV$^2$/nm$^2$ for the reference design, predicting an improvement in the transition width of the order of 43%.

Figure 3:
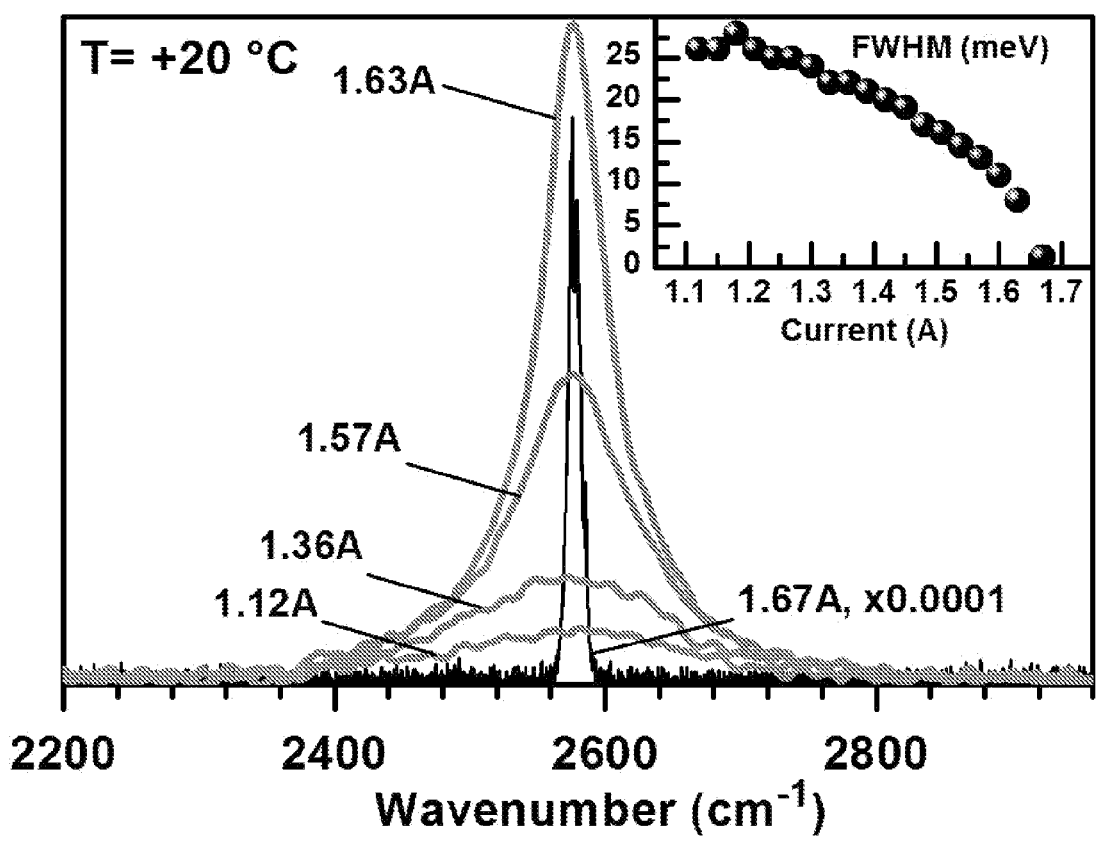
FIG. 3 shows the emission spectrum from a 25 μm×3 mm laser stripe for various drive currents.

FIG. 3 shows the emission spectrum as a function of the drive current for 25 μm×3 mm laser stripe at room temperature measured with 100-ns current pulses at a repetition rate of 10 kHz. The inset shows the half-width of the emission spectrum as a function of drive current, saturating at 26 meV as the current is reduced. Measured in the same way electroluminescence half-width at 80K saturates at approximately 20 meV. The laser and electroluminescence emission peaked at 2575 cm$^{-1}$ (3.9 μm). The inset shows the half-width of the emission spectrum as a function of drive current. The half-width of the electroluminescence saturates for low drive current at 26 meV. This is considered to be a fair approximation of the true width of the spontaneous emission free from the impact of stimulated emission. Measured in the same way, the electroluminescence half-width measured at 80 K saturates at approximately 20 meV for the current design and 42 meV for the reference design. The ≈50% narrowing of the low temperature electroluminescence spectrum is mainly due to reduced interface scattering of the upper laser state at the B1 barrier, which is in good agreement with calculated 43%. Moreover, the relatively small additional broadening of the electroluminescence due to temperature indicates that the interface scattering is the dominant broadening mechanism in our structures at cryogenic and even at room temperatures. A rough estimate of $\Delta^\wedge$ term in Eq. 1 from the low-temperature line-width of 20 meV is $\Delta^\wedge=0.6$ nm$^2$, a value that is close to values reported for solid-source epitaxial systems (Tsujino et al. Appl. Phys. Lett., 86, 062113, (2005) and Wittmann et al., Appl. Phys. Lett., 93, 141103, (2008)). Room temperature threshold current density of the current laser measured in the pulsed mode for a 25 μm×2 mm laser stripe is 3 kA/cm$^2$ and decreases to 1.75 kA/cm$^2$ as the stripe size increased to a 25 μm×5 mm. This threshold current density is 40% lower than the 4.8 kA/cm$^2$ measured for the a 28 μm×2 mm stripe of the reference laser. The threshold current density of the current design in pulsed operation is close to the best published QCLs at the similar wavelength (Yu et al., Appl. Phys. Lett. 88, 041111 (2006), Yu et al., Appl. Phys. Lett. 88, 25118 (2006), Lyakh et al., PNAS, 107, 18799 (2010)), accounting for the effect of stripe length and facet coatings.

Population inversion in a strain-compensated quantum cascade laser is significantly enhanced by increasing the interface scattering of the lower laser level and decreasing the interface scattering of the upper laser level. The design recipe based on this principle is very simple and efficient: low barriers are used in where the upper laser state has its highest probability, thus maximizing the lifetime of the upper laser state; higher barriers are used where the lower laser state and the few subsequent confined states have their highest probabilities, thus minimizing the lifetime of the lower laser state. In terms of the layer structure it is simple and straightforward to implement: the thinnest quantum well layer (W1) is followed by the lowest barrier layer (B1), followed by the thickest quantum well layer (W2) and then the highest barrier layer (B2); afterwards the thickness of the quantum well layers and the average height (in current case the average Al-content) of the barriers are gradually reduced up to the end of the period. Using this design principle to modify a reference composite-barrier, strain-compensated design led to significant improvement in performance as demonstrated by FIG. 3.

Figure 4:
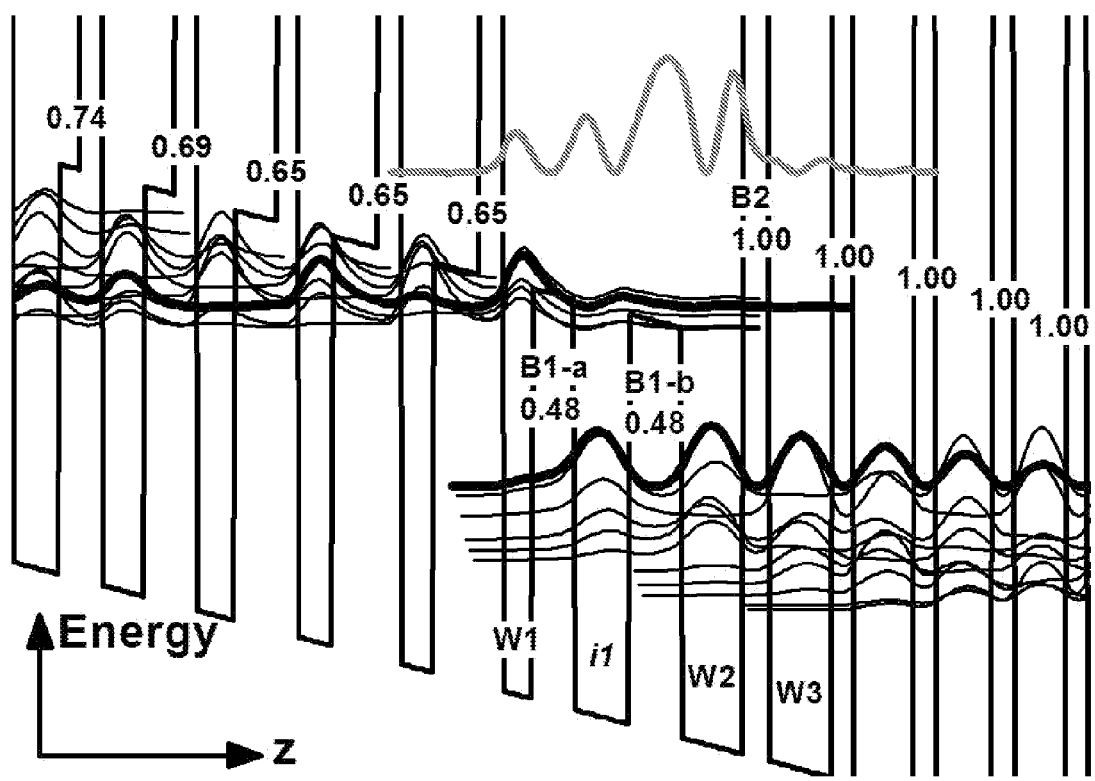
FIG. 4 depicts a conduction band edge profile for the design used within a single period (cascade) under an electric field of 65 kV/cm along with the calculated probability functions for the confined electronic states where a quantum well (i1) is inserted between the two constituent barrier layers of the lowest barrier (B1).

FIG. 4 depicts a conduction band edge profile for the design used within a single period (cascade) under an electric field of 65 kV/cm along with the calculated probability functions for the confined electronic states where a quantum well (i1) is inserted between the two constituent barrier layers of the lowest barrier (B1). The cascade shown in FIG. 4 has been found to be optimal for ~6 μm wavelength. The cascade shown in FIG. 4 has the following layers, where W=quantum well, B=barrier and the insert is a quantum well, with the stated constituent materials and layer thicknesses in the stated order:

| W1 | 1.4 nm | $In_{0.73}Ga_{0.27}As$ |
| B1-A | 2.0 nm | $In_{0.52}Al_{0.48}As$ |
| INSERT1 | 2.6 nm | $In_{0.73}Ga_{0.27}As$ |
| B1-B | 2.5 nm | $In_{0.52}Al_{0.48}As$ |
| W2 | 2.9 nm | $In_{0.73}Ga_{0.27}As$ |
| B2 | 1.2 nm | AlAs |
| W3 | 3.0 nm | $In_{0.73}Ga_{0.27}As$ |
| B3 | 1.0 nm | AlAs |
| W4 | 2.9 nm | $In_{0.73}Ga_{0.27}As$ |
| B4 | 1.0 nm | AlAs |
| W5 | 2.7 nm | $In_{0.73}Ga_{0.27}As$ |
| B5 | 1.0 nm | AlAs |
| W6 | 2.5 nm | $In_{0.73}Ga_{0.27}As$ |
| B6 | 1.0 nm | AlAs |
| W7 | 2.2 nm | $In_{0.73}Ga_{0.27}As$ |
| B7-A | 1.0 nm | $In_{0.52}Al_{0.48}As$ |
| B7-B | 1.0 nm | AlAs |
| W8 | 2.0 nm | $In_{0.73}Ga_{0.27}As$ |
| B8-A | 1.5 nm | $In_{0.52}Al_{0.48}As$ |
| B8-B | 1.0 nm | AlAs |
| W9 | 1.8 nm | $In_{0.73}Ga_{0.27}As$ |
| B9-A | 2.0 nm | $In_{0.52}Al_{0.48}As$ |
| B9-B | 1.0 nm | AlAs |
| W10 | 1.6 nm | $In_{0.73}Ga_{0.27}As$ |
| B10-A | 2.2 nm | $In_{0.52}Al_{0.48}As$ |
| B10-B | 1.1 nm | AlAs |
| W11 | 1.5 nm | $In_{0.73}Ga_{0.27}As$ |
| B11-A | 2.2 nm | $In_{0.52}Al_{0.48}As$ |
| B11-B | 1.1 nm | AlAs |

Figure 5:
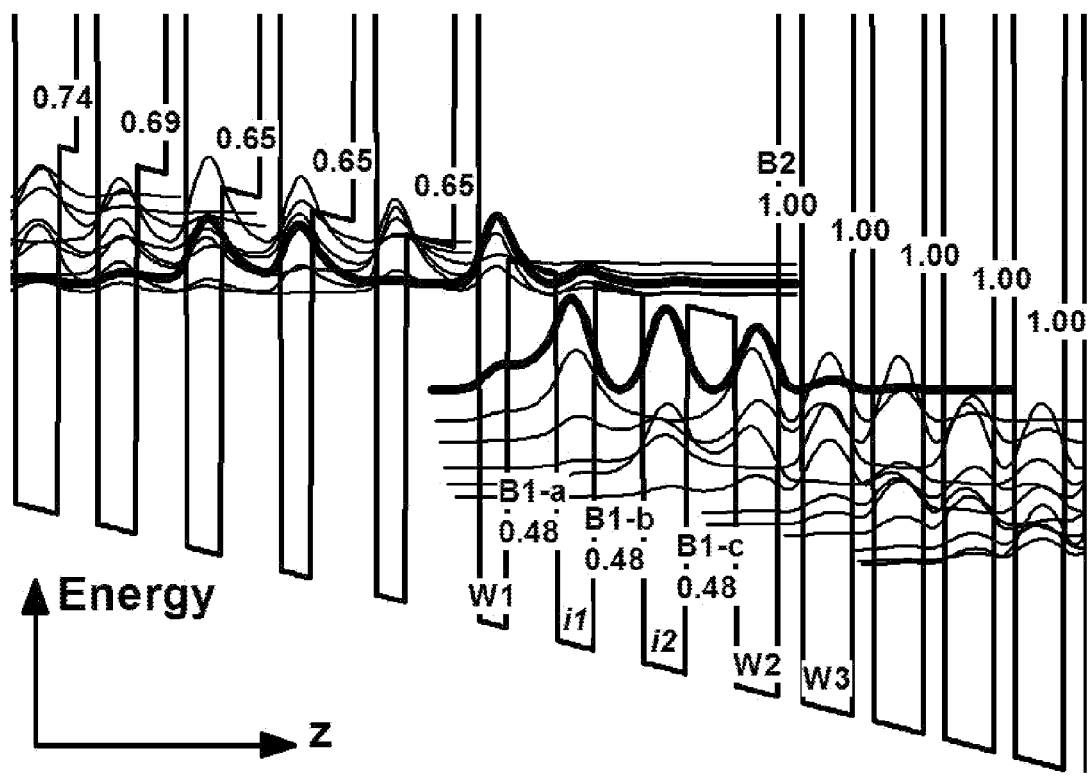
FIG. 5 depicts a conduction band edge profile for the design used within a single period (cascade) under an electric field of 65 kV/cm along with the calculated probability functions for the confined electronic states where two quantum wells (i1 and i2) are inserted between the three constituent barrier layers of the lowest barrier (B1).

FIG. 5 depicts a conduction band edge profile for the design used within a single period (cascade) under an electric field of 65 kV/cm along with the calculated probability functions for the confined electronic states where two quantum wells (i1 and i2) are inserted between the three constituent barrier layers of the lowest barrier (B1). The cascade shown in FIG. 5 was found to be optimal for ~9 μm wavelength emissions. The cascade shown in FIG. 5 has the following layers, where W=quantum well, B=barrier and the insert is a quantum well, with the stated constituent materials and layer thicknesses in the stated order:

| W1 | 1.5 nm | $In_{0.73}Ga_{0.27}As$ |
| B1-A | 2.5 nm | $In_{0.52}Al_{0.48}As$ |
| INSERT1 | 1.9 nm | $In_{0.73}Ga_{0.27}As$ |
| B1-B | 2.5 nm | $In_{0.52}Al_{0.48}As$ |
| INSERT2 | 2.2 nm | $In_{0.73}Ga_{0.27}As$ |
| B1-C | 2.5 nm | $In_{0.52}Al_{0.48}As$ |
| W2 | 2.2 nm | $In_{0.73}Ga_{0.27}As$ |
| B2 | 1.2 nm | AlAs |
| W3 | 2.6 nm | $In_{0.73}Ga_{0.27}As$ |
| B3 | 1.0 nm | AlAs |
| W4 | 2.6 nm | $In_{0.73}Ga_{0.27}As$ |
| B4 | 1.0 nm | AlAs |
| W5 | 2.6 nm | $In_{0.73}Ga_{0.27}As$ |
| B5 | 1.0 nm | AlAs |
| W6 | 2.6 nm | $In_{0.73}Ga_{0.27}As$ |
| B6 | 1.0 nm | AlAs |
| W7 | 2.2 nm | $In_{0.73}Ga_{0.27}As$ |
| B7-A | 1.0 nm | $In_{0.52}Al_{0.48}As$ |
| B7-B | 1.0 nm | AlAs |
| W8 | 2.0 nm | $In_{0.73}Ga_{0.27}As$ |
| B8-A | 1.5 nm | $In_{0.52}Al_{0.48}As$ |
| B8-B | 1.0 nm | AlAs |
| W9 | 1.8 nm | $In_{0.73}Ga_{0.27}As$ |
| B9-A | 2.0 nm | $In_{0.52}Al_{0.48}As$ |
| B9-B | 1.0 nm | AlAs |
| W10 | 1.6 nm | $In_{0.73}Ga_{0.27}As$ |
| B10-A | 2.2 nm | $In_{0.52}Al_{0.48}As$ |
| B10-B | 1.1 nm | AlAs |
| W11 | 1.5 nm | $In_{0.73}Ga_{0.27}As$ |
| B11-A | 2.5 nm | $In_{0.52}Al_{0.48}As$ |
| B11-B | 1.2 nm | AlAs |

It will be apparent to the person skilled in the art that while the invention has been described in some detail for the purposes of clarity and understanding, various modifications and alterations to the embodiments and methods described herein may be made without departing from the scope of the inventive concept disclosed in this specification.

What is claimed is:

1. A quantum cascade laser structure having a plurality of cascades each of which comprises a number of alternately arranged quantum wells and barriers of different thicknesses and heights, wherein at least one of said quantum wells and at least one of said barriers is under mechanical strain and the quantum wells and the barriers are coordinated such that the existing mechanical strains are largely compensated within one cascade, wherein each of said barriers comprise one or more barrier layers, wherein each cascade comprises sequentially:
a) a thinnest quantum well followed by
b) a lowest barrier followed by
c) a thickest quantum well, which is then immediately followed by
d) a highest barrier, and wherein said highest barrier is followed by
e) alternately arranged quantum wells and barriers.

2. The quantum cascade laser structure of claim 1, wherein said quantum wells in e) each have thickness between said thinnest quantum well and said thickest quantum well, with the quantum wells having decreasing thicknesses compared to the thickest quantum well in c) in sequential order, and wherein the barriers each have average barrier layer height that is no higher than an immediately preceding barrier.

3. The quantum cascade laser structure of claim 2, wherein the barriers in e) each have average barrier layer height that is between said lowest barrier and said highest barrier, with the barriers having decreasing average barrier layer heights compared to the highest barrier in d) in sequential order.

4. The quantum cascade laser structure of claim 1, wherein each cascade comprises InGaAs quantum wells.

5. The quantum cascade laser structure of claim 1, wherein each cascade comprises InAlAs barriers.

6. The quantum cascade laser structure of claim 1, wherein each cascade comprises AlAsSb barriers.

7. The quantum cascade laser structure of claim 1, wherein each cascade comprises InGaAs quantum wells and InAlAs or AlAsSb barriers.

8. The quantum cascade laser structure of claim 4, wherein each of said InGaAs quantum wells is independently a quantum well layer having formula $In_zGa_{1-z}As$, wherein z=0.5 to 1.0.

9. The quantum cascade laser structure of claim 5, wherein each of said InAlAs barriers is independently a barrier layer comprising $In_{1-x}Al_xAs$, wherein x=0.3 to 1.0.

10. The quantum cascade laser structure of claim 1, with
$In_xGa_{1-x}As$ with $0.5 \leq x \leq 1$ as layer constituent material of the quantum wells; and
$In_yAl_{1-y}As$ with $0.3 \leq y \leq 1$ and AlAs as layer constituent materials of at least one barrier.

11. The quantum cascade laser structure of claim 10, with $In_{0.73}Ga_{0.27}As$ as layer constituent material of the quantum wells,
$In_{0.52}Al_{0.48}As$ and AlAs as layer constituent materials of at least one barrier with at least two layer constituents, and AlAs as layer constituent material of the remaining barriers.

12. The quantum cascade laser structure of claim 1, where the cascade comprises an injection zone, an extraction zone and an active zone arranged between the injection zone and the extraction zone, with each zone comprising at least one barrier layer and at least one of the barriers in the active zone and/or in the injection zone having at least two layer constituent materials.

13. The quantum cascade laser structure of claim 1, where the thicknesses of the quantum wells and the heights of the barriers are arranged so that a wave length spectrum of an emitted laser radiation is about 2.9 to about 20 μm.

14. The quantum cascade laser structure of claim 1, wherein the thicknesses of the quantum wells and the heights of the barriers are selected and arranged so as to achieve simultaneous increased upper laser state lifetime and reduced lower laser state lifetime.

15. A quantum cascade laser comprising the quantum cascade laser structure of claim 1 and means for selecting a wavelength of emitted laser light.

16. The quantum cascade laser of claim 15 connected to a heat sink to dissipate heat generated in the operation of the laser.

17. A quantum cascade laser comprising at least one quantum well structure as set forth in claim 1.

18. A quantum cascade laser structure having a number of cascades each of which comprises a number of alternately arranged quantum wells and barriers, where
the material of at least one quantum well is under mechanical strain,
the material of at least one barrier layer is under mechanical strain;
the quantum wells and the barriers are coordinated such that the existing mechanical strains are largely compensated within one cascade, wherein a cascade comprises the following layers with the stated constituent materials and layer thicknesses in the stated order:
an $In_xGa_{1-x}As$-layer with $0.6 \leq x \leq 1$, with a thickness of 0.9 to 1.3 nm;
an $In_zAl_{1-z}As$ layer with $0.45 \leq z \leq 0.65$, with a thickness of 1.0 to 3.0 nm;
an $In_xGa_{1-x}As$-layer with $0.6 \leq x \leq 1$, with a thickness of 3.5 to 4.5 nm;
an $In_zAl_{1-z}As$-layer with $0 \leq z \leq 0.4$, with a thickness of 1.0 to 1.4 nm;
an $In_xGa_{1-x}As$-layer with $0.6 \leq x \leq 1$, with a thickness of 3.4 to 4.0 nm;
an $In_zAl_{1-z}As$-layer with $0 \leq z \leq 0.4$, with a thickness of 1.4 to 1.8 nm;
an $In_xGa_{1-x}As$-layer with $0.6 \leq x \leq 1$, with a thickness of 2.8 to 3.2 nm;
an $In_zAl_{1-z}As$-layer with $0 \leq z \leq 0.4$, with a thickness of 1.2 to 1.6 nm;
an $In_xGa_{1-x}As$-layer with $0.6 \leq x \leq 1$, with a thickness of 2.5 to 2.9 nm;
an $In_zAl_{1-z}As$-layer with $0 \leq z \leq 0.4$, with a thickness of 1.0 to 1.4 nm;
an $In_xGa_{1-x}As$-layer with $0.6 \leq x \leq 1$, with a thickness of 2.2 to 2.6 nm;
an $In_zAl_{1-z}As$-layer with $0 \leq z \leq 0.4$, with a thickness of 0.8 to 1.2 nm;
an $In_xGa_{1-x}As$-layer with $0.6 \leq x \leq 1$, with a thickness of 2.1 to 2.5 nm;
an $In_zAl_{1-z}As$-layer with $0 \leq z \leq 0.4$, with a thickness of 0.7 to 1.1 nm;
an $In_xGa_{1-x}As$-layer with $0.6 \leq x \leq 1$, with a thickness of 1.8 to 2.1 nm;
an $In_zAl_{1-z}As$-layer with $0 \leq z \leq 0.55$, with a thickness of 1.7 to 2.1 nm;
an $In_xGa_{1-x}As$-layer with $0.6 \leq x \leq 1$, with a thickness of 1.7 to 2.1 nm;
an $In_zAl_{1-z}As$-layer with $0 \leq z \leq 0.55$, with a thickness of 2.6 to 3.2 nm;
an $In_xGa_{1-x}As$-layer with $0.6 \leq x \leq 1$, with a thickness of 1.4 to 1.8 nm;
an $In_zAl_{1-z}As$-layer with $0 \leq z \leq 0.55$, with a thickness of 3.5 to 4.3 nm.

19. The quantum cascade laser structure of claim 18, wherein said cascade comprises the following layers with the stated constituent materials and layer thicknesses in the stated order:
an $In_{0.73}Ga_{0.27}As$ layer with a thickness of about 1.1 nm;
an InAlAs layer with a thickness of about 2.0 nm;
an $In_{0.73}Ga_{0.27}As$ layer with a thickness of about 4.0 nm;

an InAlAs layer with a thickness of about 1.2 nm;
an $In_{0.73}Ga_{0.27}As$ layer with a thickness of about 3.7 nm;
an InAlAs layer with a thickness of about 1.6 nm;
an $In_{0.73}Ga_{0.27}As$ layer with a thickness of about 3.0 nm;
an InAlAs layer with a thickness of about 1.4 nm;
an $In_{0.73}Ga_{0.27}As$ layer with a thickness of about 2.7 nm;
an InAlAs layer with a thickness of about 1.2 nm;
an $In_{0.73}Ga_{0.27}As$ layer with a thickness of about 2.4 nm;
an InAlAs layer with a thickness of about 1.0 nm;
an $In_{0.73}Ga_{0.27}As$ layer with a thickness of about 2.3 nm;
an InAlAs layer with a thickness of about 0.9 nm;
an $In_{0.73}Ga_{0.27}As$ layer with a thickness of about 2.0 nm;
an InAlAs layer with a thickness of about 1.9 nm;
an $In_{0.73}Ga_{0.27}As$ layer with a thickness of about 1.9 nm;
an InAlAs layer with a thickness of about 2.9 nm;
an $In_{0.73}Ga_{0.27}As$ layer with a thickness of about 1.6 nm;
an InAlAs layer with a thickness of about 3.9 nm.

20. A quantum cascade laser structure having a plurality of cascades each of which comprises a number of alternately arranged quantum wells and barriers of different thicknesses and heights, wherein at least one of said quantum wells and at least one of said barriers is under mechanical strain and the quantum wells and the barriers are coordinated such that the existing mechanical strains are largely compensated within one cascade, wherein each of said barriers comprise one or more barrier layers, wherein each cascade comprises sequentially:
a) a thinnest quantum well followed by
b) a lowest barrier followed by
c) a thickest quantum well, which is then immediately followed by
d) a highest barrier, and wherein said highest barrier is followed by
e) alternately arranged quantum wells and barriers, wherein said quantum wells each have thickness between said thinnest quantum well and said thickest quantum well, with the quantum wells having decreasing thicknesses compared to the thickest quantum well in c) in sequential order, and wherein the barriers each have average barrier layer height that is no higher than an immediately preceding barrier.

21. The quantum cascade laser structure of claim 20, wherein the barriers in e) each have average barrier layer height that is between said lowest barrier and said highest barrier, with the barriers having decreasing average barrier layer heights compared to the highest barrier in d) in sequential order.

* * * * *